(12) United States Patent
Choe

(10) Patent No.: US 12,230,869 B2
(45) Date of Patent: Feb. 18, 2025

(54) WEARABLE ELECTRONIC DEVICE INCLUDING ANTENNA

(71) Applicant: Samsung Electronics Co., Ltd., Gyeonggi-do (KR)

(72) Inventor: Jaewon Choe, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 127 days.

(21) Appl. No.: 17/974,982

(22) Filed: Oct. 27, 2022

(65) Prior Publication Data

US 2023/0121025 A1 Apr. 20, 2023

Related U.S. Application Data

(63) Continuation of application No. PCT/KR2022/014628, filed on Sep. 29, 2022.

(30) Foreign Application Priority Data

Oct. 18, 2021 (KR) .......................... 10-2021-0138363

(51) Int. Cl.
*H05K 1/02* (2006.01)
*G02C 11/00* (2006.01)
(Continued)

(52) U.S. Cl.
CPC ............. *H01Q 1/273* (2013.01); *G02C 11/10* (2013.01); *H01Q 1/50* (2013.01); *H05K 1/0277* (2013.01)

(58) Field of Classification Search
CPC .......... H01Q 1/273; H01Q 1/50; G02C 11/10; H05K 1/0277
(Continued)

(56) References Cited

U.S. PATENT DOCUMENTS 10,381,711 B2    8/2019  Togashi
2010/0309426 A1* 12/2010 Howell .................. G02C 5/146
                                                              351/158

(Continued)

FOREIGN PATENT DOCUMENTS

CN       209448018 U     9/2019
CN       211263977 U     8/2020
(Continued)

OTHER PUBLICATIONS

International Search Report dated Jan. 10, 2023.
Extended European Search Report dated Dec. 4, 2024.

*Primary Examiner* — Binh B Tran
(74) *Attorney, Agent, or Firm* — Cha & Reiter, LLC

(57) ABSTRACT

A wearable electronic device is disclosed, including: a bridge; a first and second rim; a first and second glass; a first and second temple that are foldable, a first printed circuit substrate within the first temple and including a wireless communication module; an flexible printed circuit substrate electrically connected to the first PCB, disposed in the first rim, the bridge, and the second rim, and including a feed part and a ground; a conductive pattern disposed in the first rim, the bridge, and the second rim; and a conductive stub electrically connected to the conductive pattern, wherein the conductive pattern includes a first part electrically connected to the feed part and extending through the first rim, the bridge, the second rim, and the first rim, and a second part electrically connected to the ground, wherein the conductive stub includes a first part electrically connected to the feed part.

20 Claims, 9 Drawing Sheets

(51) Int. Cl.
*H01Q 1/27* (2006.01)
*H01Q 1/50* (2006.01)

(58) Field of Classification Search
USPC .......................................................... 361/749
See application file for complete search history.

(56) References Cited

U.S. PATENT DOCUMENTS

| | | |
|---|---|---|
| 2013/0044042 A1 | 2/2013 | Olsson et al. |
| 2014/0240474 A1 | 8/2014 | Kondo |
| 2016/0190678 A1 | 6/2016 | Hong et al. |
| 2016/0204839 A1* | 7/2016 | Liu .......................... H04W 4/02 |
| | | 345/8 |
| 2019/0229395 A1 | 7/2019 | Hintermann et al. |
| 2020/0119433 A1 | 4/2020 | Ashwood et al. |
| 2020/0264455 A1 | 8/2020 | Olgun et al. |
| 2020/0393685 A1 | 12/2020 | Isaacs et al. |
| 2021/0149224 A1* | 5/2021 | Zhang .................... G02C 11/10 |
| 2021/0215952 A1 | 7/2021 | Fang et al. |
| 2023/0032316 A1* | 2/2023 | Hintermann ....... G02B 27/0172 |

FOREIGN PATENT DOCUMENTS

| | | |
|---|---|---|
| JP | 2003-202525 A | 7/2003 |
| KR | 10-2016-0071572 A | 6/2016 |
| KR | 10-2005997 B1 | 7/2019 |
| KR | 10-2019-0120349 A | 10/2019 |
| KR | 10-2020-0106207 A | 9/2020 |

\* cited by examiner

WEARABLE ELECTRONIC DEVICE INCLUDING ANTENNA

CROSS-REFERENCE TO RELATED APPLICATION(S)

This application is a continuation of International Application No. PCT/KR2022/014628, which was filed on Sep. 29, 2022, and claims priority to Korean Patent Application No. 10-2021-0138363, filed on Oct. 18, 2021, in the Korean Intellectual Property Office, the disclosures of which are incorporated by reference herein their entirety.

BACKGROUND

Technical Field

Certain embodiments of the disclosure relate to wearable electronic devices, and, more particularly, to improving antenna performance for wearable electronic devices.

Description of Related Art

In recent times, wearable electronic devices have gained in prominence and market penetration. Such devices include augmented reality (AR) headsets, which sometimes can take the form of a pair of glasses (e.g., smart-glasses) and other head-mounted displays (HMD).

Wearable electronic device may transceive with another electronic device through, for example, wireless communication.

The wearable electronic device may include at least one antenna (e.g., a structure including a conductive pattern) so as to perform wireless communication with other, external electronic devices.

AR glasses are a type of wearable electronic device which take the form of glasses and/or smart-glasses, which can display various content to or via the glass surface (e.g., a lens).

Such AR-enabled glasses may implemented so as to include rims (e.g., the frames) and temples (e.g., the arms extending from the glasses rim), which may be connected thereto using hinges which permit folding and unfolding of the temples with respect to the rims.

To increase convenience and comfort, there are concerted efforts to reduce the weight of such wearable electronic devices. However, as the weight is reduced, the mounting space in the devices is often reduced for components, such as the antenna. As a result, the performance of any wireless communication may be degraded.

The wearable electronic device may be configured such that the antenna is disposed in one or both of the temples. When a user wears the wearable electronic device and a part of their body (e.g., the head, a face) contacts with the temples, a specific absorption rate (SAR) of radiation from the antenna to their body may be increased, and radiation performance of the antenna may be reduced.

SUMMARY

Certain embodiments of the disclosure may provide a wearable electronic device including an antenna (e.g., implemented via a conductive pattern or a loop antenna) disposed between first glass and a first rim, in a bridge, and between second glass and a second rim.

Objects to be solved in the disclosure are not limited to the aforementioned objects, and the other objects not described above may be evidently understood from the following description by a person having ordinary knowledge in the art to which the disclosure pertains.

A wearable electronic device according to certain embodiments of the disclosure may include a bridge; a first rim disposed on a first side of the bridge and a second rim disposed on a second side of the bridge opposite to the first side; a first glass at least partly surrounded by the first rim, and a second glass at least partly surrounded by the second rim; a first temple movably connected to at least a part of the first rim using a first hinge part, and a second temple movably connected to at least a part of the second rim using a second hinge part; a first printed circuit substrate (PCB) disposed within the first temple and including a wireless communication module; an flexible printed circuit substrate (FPCB) that is electrically connected to the first PCB, disposed in at least a part of the first rim, the bridge, and the second rim, and including a feed part and a ground; a conductive pattern disposed in at least a part of the first rim, the bridge, and the second rim; and a conductive stub electrically connected to a part of the conductive pattern, wherein the conductive pattern includes: a first part electrically connected to the feed part and extending through the first rim, the bridge, the second rim, and the first rim, and a second part electrically connected to the ground, and wherein the conductive stub includes a first part that is electrically connected to the feed part.

A wearable electronic device according to certain embodiments of the disclosure may include a bridge; a first rim disposed on a first side of the bridge and a second rim disposed on a second side of the bridge which is opposite to the first side; a first glass at least partly surrounded by the first rim, and a second glass at least partly surrounded by the second rim; a first temple movably connected to at least a part of the first rim using a first hinge part, and a second temple operatively connected to at least a part of the second rim using a second hinge part; a first printed circuit substrate (PCB) disposed within the first temple and including a ground; a wireless communication module disposed on the first PCB and including a feed part; and a first antenna including a conductive pattern formed thereon disposed in at least a part of the first rim, the bridge, and the second rim, wherein the conductive pattern includes a first part electrically connected to the feed part and extending through the first rim, the bridge, the second rim, and wherein the first rim includes a second part electrically connected to the ground.

According to certain embodiments of the disclosure, the wearable electronic device can be provided which can reduce the SAR of the antenna for the body, prevent degradation of performance of the antenna, and more efficiently allocate the mounting space for the antenna (e.g., a conductive pattern), via disposition of the antenna between first glass and a first rim, in a bridge, and between second glass and a second rim.

In addition, various effects which may be directly or indirectly understood through this document may be provided.

BRIEF DESCRIPTION OF THE DRAWINGS

In relation to the description of the drawings, the same or similar reference numerals may be used with respect to the same or similar constituent elements, in which.

DETAILED DESCRIPTION

Figure 1:
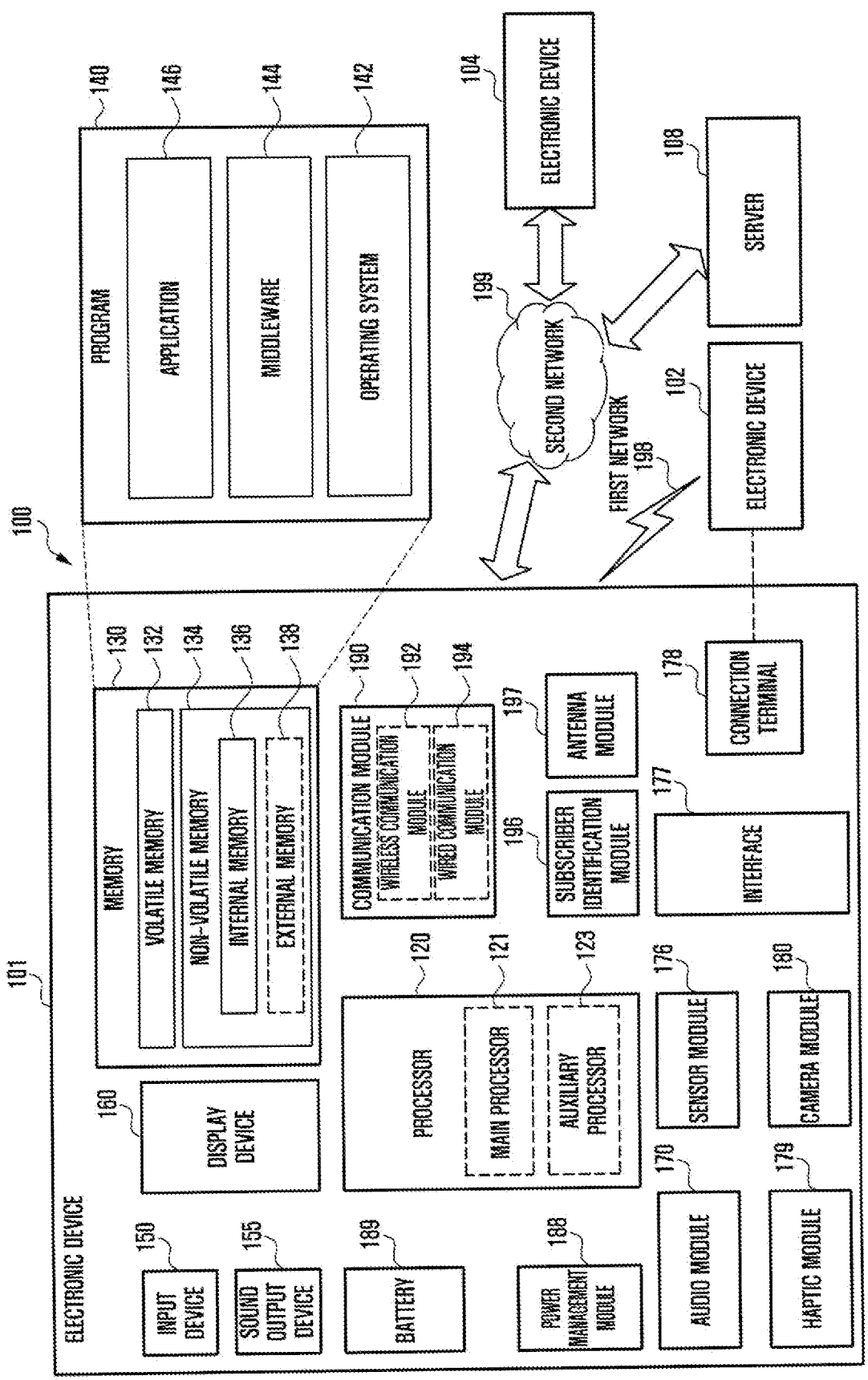
FIG. 1 is a block diagram of an electronic device in a network environment according to certain embodiments of the disclosure.

FIG. 1 is a block diagram of an electronic device in a network environment according to certain embodiments of the disclosure.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134, which may in turn include the internal memory 136 and/or external memory 138. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element implemented using a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used in connection with certain embodiments of the disclosure, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Figure 2:
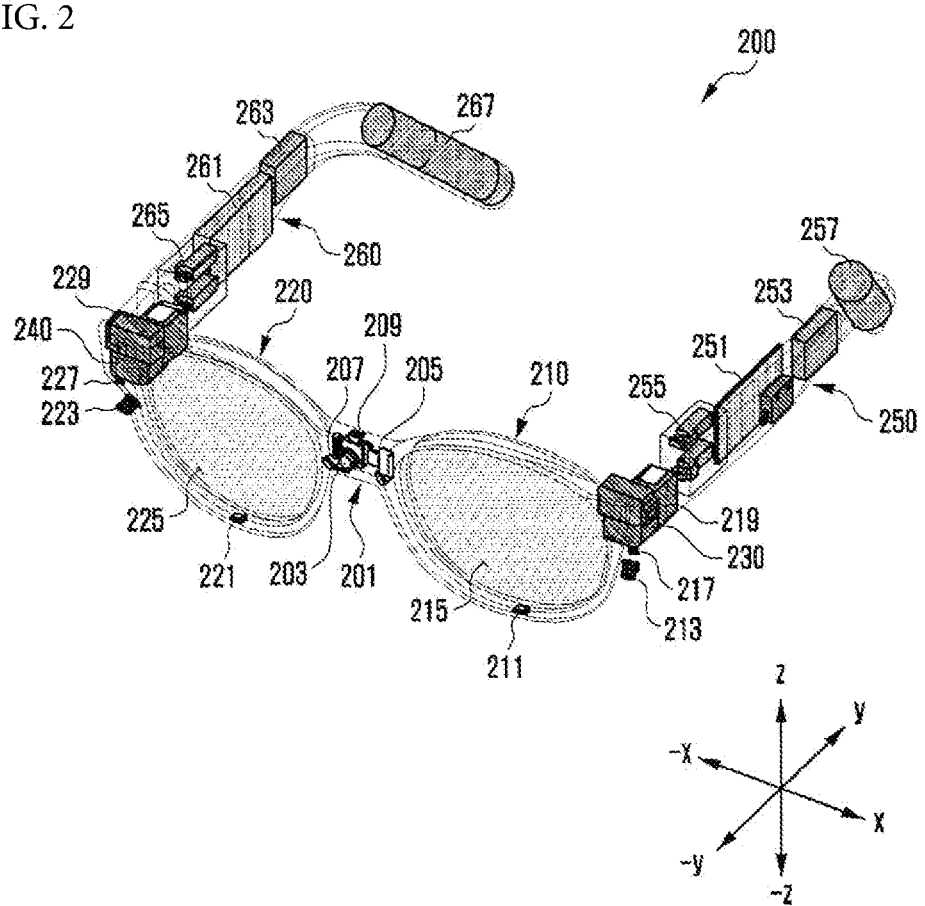
FIG. 2 is a perspective view schematically illustrating a implementation of a wearable electronic device according to certain embodiments of the disclosure.

FIG. 2 is a perspective view schematically illustrating a implementation of a wearable electronic device according to certain embodiments of the disclosure.

A wearable electronic device 200 in FIG. 2 may include embodiments described in relation to the electronic device 101 in FIG. 1. The wearable electronic device 200 may include augmented reality (AR) glass implemented in the form of a pair of glasses, or a pair of smart-glasses.

With reference to FIG. 2, the wearable electronic device 200 according to certain embodiments of the disclosure may include a bridge 201, a first rim 210, a second rim 220, a first end piece 230, a second end piece 240, a first temple 250 and/or a second temple 260.

According to an embodiment, the bridge 201 may connect the first rim 210 and the second rim 220. The bridge 201 may be rest on the nose of a user when the wearable electronic device 200 is worn. For example, the first rim 210 and the second rim 220 may be separated from each other on the basis of the bridge 201.

According to certain embodiments, the bridge 201 may include a camera module 203, a first eye tracking camera 205, a second eye tracking camera 207 and/or an audio module 209.

According to certain embodiments, the camera module 203 (e.g., the camera module 180 in FIG. 1) may be oriented to capture images from a front (e.g., a −y axis direction) of a user (e.g., a user of the wearable electronic device 200), and may obtain image data. The camera module 203 may photograph an image corresponding to a field of view (FoV) of a user and/or may implement depth-measurement for detecting a distance from a subject of photographic capture (e.g., an object). The camera module 203 may include an RGB camera, a high resolution (HR) camera and/or a photo video (PV) camera. In order to obtain high quality images, the camera module 203 may include a color camera having an auto focus (AF) function and an optical image stabilization (OIS) function.

According to certain embodiments, the first eye tracking camera 205 and the second eye tracking camera 207 may identify a user's line of sight. The first eye tracking camera 205 and the second eye tracking camera 207 may visually track the pupils of a user, and may thus be oriented in a direction opposite to a photographic direction of the camera module 203. For example, the first eye tracking camera 205 may partially capture the left eye of a user, and the second eye tracking camera 207 may partially capture the right eye of the user. The first eye tracking camera 205 and the second eye tracking camera 207 may detect the pupils (e.g., the left eye and the right eye) of a user within the captured image stream, and utilize the same to track the user's line of sight. The tracked direction of the line of sight may be used to detect center of a virtual image where the user's focus lies, including a virtual object, so that this center can move in accordance with changes in the direction of the line of sight. The first eye tracking camera 205 and/or the second eye tracking camera 207 may track a line of sight of a user by using at least one method among an electro-oculography or electrooculogram (EOG) sensor, a coil system, a dual Purkinje system, bright pupil systems, or dark pupil systems, for example.

According to certain embodiments, the audio module 209 (e.g., the audio module 170 in FIG. 1) may be disposed between the first eye tracking camera 205 and the second eye tracking camera 207. The audio module 209 may convert a voice of a user into an electrical signal or convert an electrical signal into a sound. The audio module 209 may include a microphone.

According to an embodiment, the first rim 210 and the second rim 220 may form frames (e.g., glasses frames) of the wearable electronic device 200 (e.g., AR glass). The first rim 210 may be disposed on a first side (e.g., in a first direction, such as an x axis direction) of the bridge 201. The first rim 210 may be disposed at a location corresponding to the left eye of the user. The second rim 220 may be disposed on a second side (e.g., in a second direction, such as an −x axis direction) of the bridge 201 (e.g., a direction opposite to the first direction, being the x axis direction). The second rim 220 may be disposed at a location corresponding to the right eye of the user. The first rim 210 and the second rim 220 may be formed by using a metal material and/or a non-metal material (e.g., polymer).

According to certain embodiments, the first rim 210 may surround and support at least a part of first glass 215 (e.g., a first display) disposed in the inner circumference surface of the first rim 210. The first glass 215 may be disposed in front of the left eye of a user. The second rim 220 may surround and support at least a part of second glass 225 (e.g., a second display) disposed in the inner circumference surface of the second rim 220. The second glass 225 may be disposed in front of the right eye of the user. A user of the wearable electronic device 200 may watch a foreground (e.g., an actual image) of an outside object (e.g., a subject for photographing) through the first glass 215 and the second glass 225. The wearable electronic device 200 may implement AR display by overlapping and displaying a virtual image in a foreground of a real-world object seen through transparency of the first glass 215 and second glass 225.

According to certain embodiments, the first glass 215 and the second glass 225 may include a projection type transparent display. Each of the first glass 215 and the second glass 225 may form a reflected surface as a transparent plate (or a transparent screen). An image generated by the wearable electronic device 200 may be reflected (e.g., total internal reflection) through the reflected surfaces, and may be incident on the left eye and right eye of a user. In an embodiment, the first glass 215 may include a waveguide for delivering, to the left eye of a user, light generated by a light source of the wearable electronic device 200. For example, the waveguide may be formed by using glass, plastic, or polymer material, and may include a nano pattern (e.g., a grating structure or mesh structure having a polygon or a curved shape) formed within or on a surface of the first glass 215. The waveguide may include at least one of at least one diffraction element (e.g., a diffractive optical element (DOE), a holographic optical element (HOE)) or a reflection element (e.g., a reflection mirror). The waveguide may guide, into an eye of a user, display light emitted from the light source by using at least one diffraction element or a reflection element included in the waveguide. In certain embodiments, the diffraction element may include an input/output optical member. The reflection element may include total internal reflection (TIR). For example, a light path of light emitted from the light source may be guided into the waveguide through the input optical member. Light that moves through the waveguide may be guided in an eye direction of a user through the output optical member. The second glass 225 may be implemented substantially in the same manner as the first glass 215.

According to certain embodiments, the first glass 215 and the second glass 225 may include a liquid crystal display (LCD), a digital mirror device (DMD), liquid crystal on silicon (LCoS), an organic light emitting diode (OLED), or a micro light emitting diode (micro LED), for example. Although not illustrated, if the first glass 215 and the second glass 225 include one of an LCD, a DMD, or LCoS, the wearable electronic device 200 may include a light source for radiating light to screen output areas of the first glass 215 and the second glass 225. In another embodiment, if the first glass 215 and the second glass 225 can autonomously generate light, for example, if the first glass 215 and the second glass 225 include one of an OLED or a micro LED, the wearable electronic device 200 can provide a user with a virtual image having excellent quality although a separate light source is not included.

According to certain embodiments, the first rim 210 may include a first microphone 211, a first recognition camera 213, a first light-emitting device 217 and/or a first display module 219. The second rim 220 may include a second microphone 221, a second recognition camera 223, a second light-emitting device 227 and/or a second display module 229.

In certain embodiments, the first light-emitting device 217 and the first display module 219 may be included in the first end piece 230. The second light-emitting device 227 and the second display module 229 may be included in the second end piece 240.

According to certain embodiments, the first microphone 211 and/or the second microphone 221 may receive a voice of a user of the wearable electronic device 200, and may convert the voice into an electrical signal.

According to certain embodiments, the first recognition camera 213 and/or the second recognition camera 223 may recognize a surrounding space of the wearable electronic device 200. The first recognition camera 213 and/or the second recognition camera 223 may detect a gesture of a user within a given distance (e.g., a given space) of the wearable electronic device 200. The first recognition camera 213 and/or the second recognition camera 223 may include a global shutter (GS) camera in which a rolling shutter (RS) phenomenon may be reduced, in order to detect and track a fast hand movement of a user and/or a fine movement for a finger. The wearable electronic device 200 may detect an eye corresponding to a fixing eye and/or a supplementary eye among the left eye and/or right eye of a user by using the first eye tracking camera 205, the second eye tracking camera 207, the first recognition camera 213 and/or the second recognition camera 223. For example, the wearable electronic device 200 may distinguish between a fixing eye and/or a supplementary eye of the user, based on a direction of a line of sight when viewing an outside object or a virtual object.

According to certain embodiments, the first light-emitting device 217 and/or the second light-emitting device 227 may emit light in order to increase the accuracy of the camera module 203, the first eye tracking camera 205, the second eye tracking camera 207, the first recognition camera 213 and/or the second recognition camera 223. The first light-emitting device 217 and/or the second light-emitting device 227 may be used as assistant for increasing accuracy when a pupil of a user is photographed by using the first eye tracking camera 205 and/or the second eye tracking camera 207. The first light-emitting device 217 and/or the second light-emitting device 227 may be used as assistant means when it is not easy to detect an object (e.g., a subject for photographing) to be photographed due to a dark environment or the mixing of several light sources and reflected light if a gesture of a user is photographed by using the first recognition camera 213 and/or the second recognition camera 223. The first light-emitting device 217 and/or the second light-emitting device 227 may include an LED, an IR LED, or a xenon lamp, for example.

According to certain embodiments, the first display module 219 and/or the second display module 229 may emit light, and may transmit the emitted light to the left eye and/or right eye of a user by using the first glass 215 and/or the second glass 225. The first glass 215 and/or the second glass 225 may display various types of image information using the light emitted through the first display module 219 and/or the second display module 229. The first display module 219 and/or the second display module 229 may include the display module 160 in FIG. 1. The wearable electronic device 200 may overlap and display, through the first glass 215 and/or the second glass 225, a foreground of an outside object and an image discharged through the first display module 219 and/or the second display module 229.

According to an embodiment, the first end piece 230 may be combined with a part (e.g., the x axis direction) of the first rim 210. The second end piece 240 may be combined with a part (e.g., the −x axis direction) of the second rim 220. In certain embodiments, the first light-emitting device 217 and the first display module 219 may be included in the first end piece 230. The second light-emitting device 227 and the second display module 229 may be included in the second end piece 240.

According to certain embodiments, the first end piece 230 may connect the first rim 210 and the first temple 250. The second end piece 240 may connect the second rim 220 and the second temple 260.

According to an embodiment, the first temple 250 may be operatively connected to the first end piece 230 using a first hinge part 255. The first hinge part 255 may be rotatable so that the first temple 250 may be folded or unfolded with respect to the first rim 210. The first temple 250 may extend along the left side of the head of a user, for example. A tail part (e.g., a y axis direction) of the first temple 250 may be bent so that when a user wears the wearable electronic device 200, the tail part may secure the device to the left ear of the user. The second temple 260 may be operatively connected to the second end piece 240 by using a second hinge part 265. The second hinge part 265 may be rotatable so that the second temple 260 may be folded or unfolded with respect to the second rim 220. The second temple 260 may extend along the right side of the head of a user, for example. A tail part (e.g., the y axis direction) of the second temple 260 may include a bend, so that when a user wears the wearable electronic device 200 the tail part may secure the device to the right ear of the user.

According to certain embodiments, the first temple 250 may include a first printed circuit substrate 251, a first sound output module 253 (e.g., the sound output module 155 in FIG. 1) and/or a first battery 257 (e.g., the battery 189 in FIG. 1). The second temple 260 may include a second printed circuit substrate 261, a second sound output module 263 (e.g., the sound output module 155 in FIG. 1) and/or a second battery 267 (e.g., the battery 189 in FIG. 1).

According to certain embodiments, various electronic parts (e.g., at least some of the components included in the electronic device 101 in FIG. 1), such as the processor 120, the memory 130, the interface 177 and/or the wireless communication module 192 disclosed in FIG. 1, may be mounted on the first printed circuit substrate 251 and/or the second printed circuit substrate 261. The processor may include one or more of a central processing unit, an application processor, a graphic processor, an image signal processor, a sensor hub processor, or a communication processor, for example. The first printed circuit substrate 251 and/or the second printed circuit substrate 261 may include a printed circuit board (PCB), a flexible PCB (FPCB), or a rigid-flexible PCB (RFPCB), for example. In an embodiment, the first printed circuit substrate 251 and/or the second printed circuit substrate 261 may include a main PCB, a slave PCB partially overlapped with the main PCB and disposed therein and/or an interposer substrate between the main PCB and the slave PCB. The first printed circuit substrate 251 and/or the second printed circuit substrate 261 may be electrically connected to other components (e.g., the camera module 203, the first eye tracking camera 205, the second eye tracking camera 207, the audio module 209, the first microphone 211, the first recognition camera 213, the first light-emitting device 217, the first display module 219, the second microphone 221, the second recognition camera 223, the second light-emitting device 227, the second display module 229, the first sound output module 253 and/or the second sound output module 263) by using an electrical path, such as an FPCB and/or a cable. For example, the FPCB and/or the cable may be disposed in at least some of the first rim 210, the bridge 201 and/or the second rim 220. In an embodiment, the wearable electronic device 200 may include one of the first printed circuit substrate 251 or the second printed circuit substrate 261.

According to certain embodiments, the first sound output module 253 and/or the second sound output module 263 may deliver an audio signal to the left and/or right ears of a user. The first sound output module 253 and/or the second sound output module 263 may include a piezo speaker (e.g., a bone conduction speaker) for delivering an audio signal without a speaker hole, for example. In an embodiment, the wearable electronic device 200 may include one of the first sound output module 253 or the second sound output module 263.

According to certain embodiments, the first battery 257 and/or the second battery 267 may supply power to the first printed circuit substrate 251 and/or the second printed circuit substrate 261 by using a power management module (e.g., the power management module 188 in FIG. 1). The first battery 257 and/or the second battery 267 may include a primary cell incapable of being recharged, a secondary cell capable of being recharged, or a fuel cell, for example. In an embodiment, the wearable electronic device 200 may include one of the first battery 257 or the second battery 267.

According to certain embodiments, the wearable electronic device 200 may include a sensor module (e.g., the sensor module 176 in FIG. 1). The sensor module may generate an electrical signal or data value that corresponds to an operating state within the wearable electronic device 200 or an external environment state. The sensor module may further include at least one of a gesture sensor, a gyro sensor, an atmospheric sensor, a magnetic sensor, an acceleration sensor, a grip sensor, a color sensor, an infrared (IR) sensor, a bio sensor (e.g., an HRM sensor), a temperature sensor, a humidity sensor, or an illuminance sensor, for example. In an embodiment, the sensor module may recognize bio information of a user by using various bio sensors (or a bio recognition sensor), such as an e-nose sensor, an electromyography (EMG) sensor, an electroencephalogram (EEG) sensor, an electrocardiogram (ECG) sensor, or an iris sensor.

According to certain embodiments, in the aforementioned description, it has been described that the wearable electronic device 200 is a device which displays AR by using the first glass 215 and the second glass 225, but the disclosure is not limited thereto. The wearable electronic device 200 may be a device which displays virtual reality (VR).

Figure 3:
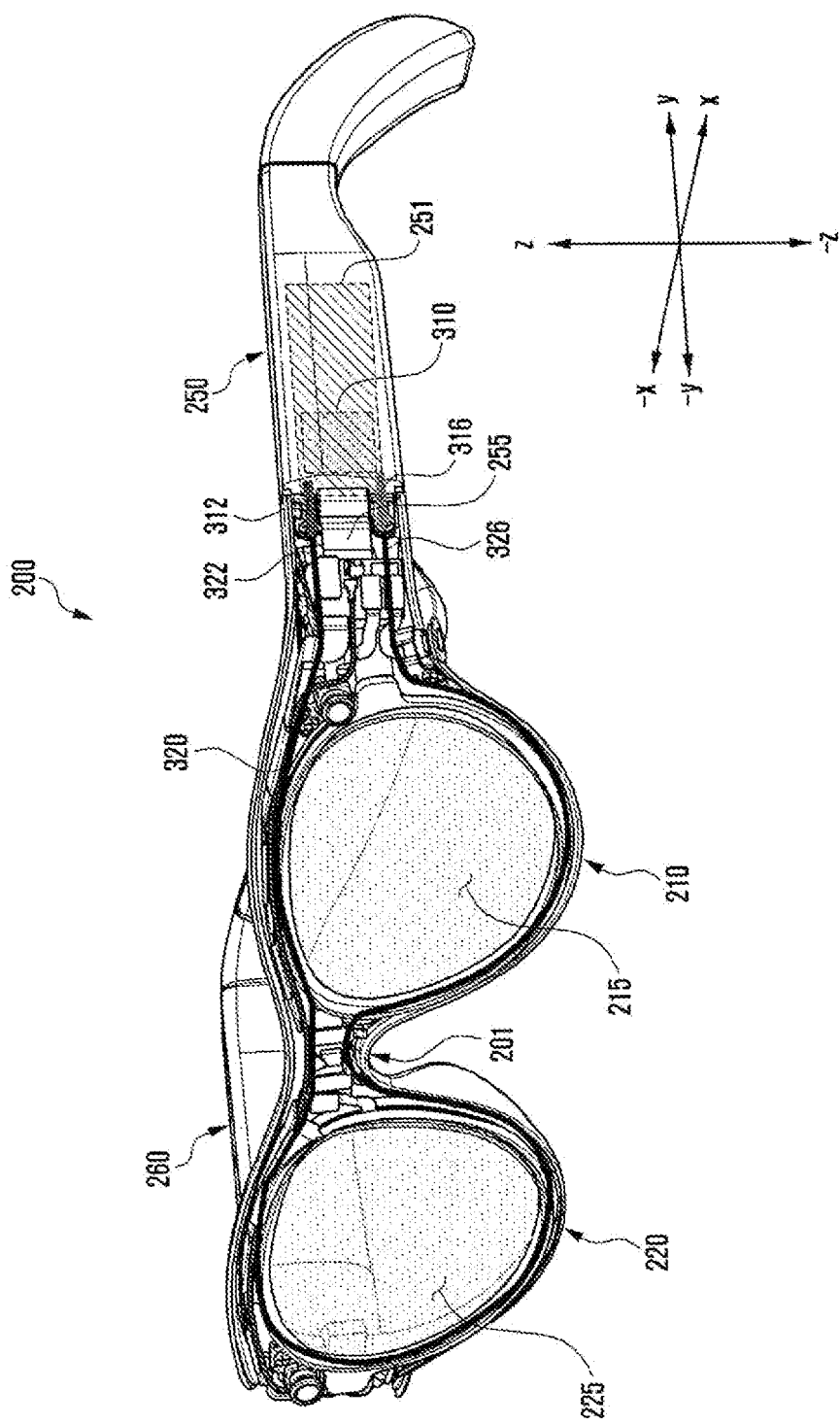
FIG. 3 is a perspective view schematically illustrating a wearable electronic device including an antenna according to certain embodiments of the disclosure.

FIG. 3 is a perspective view schematically illustrating a wearable electronic device including an antenna according to certain embodiments of the disclosure.

A wearable electronic device 200 in FIG. 3 may include embodiments described in relation to the wearable electronic device 200 in FIG. 2. The wearable electronic device 200 disclosed in FIG. 3 may be a drawing illustrating some components of the wearable electronic device 200 disclosed in FIG. 2. The wearable electronic device 200 disclosed in FIG. 3 may be integrated with or applied to the wearable electronic device 200 in FIG. 2. In the description of FIG. 3, substantially the same components as those of the embodiment of the wearable electronic device 200 in FIG. 2 may be assigned the same reference numerals, and a redundant description thereof may be omitted.

With reference to FIG. 3, the wearable electronic device 200 according to certain embodiments of the disclosure may include a bridge 201, a first rim 210, a second rim 220, a first temple 250, a second temple 260 and/or a conductive pattern 320.

According to an embodiment, the bridge 201 may connect the first rim 210 and the second rim 220. The bridge 201 may be formed by using a non-metal material (e.g., polymer).

According to an embodiment, the first rim 210 and the second rim 220 may form a frame (e.g., a glasses frame) of the wearable electronic device 200. The first rim 210 and the second rim 220 may be formed by using anon-metal material (e.g., anon-conductive injection).

According to certain embodiments, as described earlier, the first rim 210 may be disposed in a first direction (e.g., an x axis direction) of the bridge 201. The first rim 210 may be disposed around the left eye of a user. The second rim 220 may be disposed in a second direction (e.g., an −x axis direction) of the bridge 201, that is, a direction opposite to the first direction (e.g., the x axis direction). The second rim 220 may be disposed around the right eye of the user.

According to an embodiment, the first rim 210 may surround and support at least a part of first glass 215 (e.g., a first display) disposed in an inner circumference surface of the first rim 210. The first glass 215 may be disposed ahead of the left eye of a user. The second rim 220 may surround and support at least a part of second glass 225 (e.g., a second display) disposed in an inner circumference surface of the second rim 220. The second glass 225 may be disposed ahead of the right eye of the user.

According to an embodiment, the first temple 250 may be operatively connected to at least a part of the first rim 210 by using a first hinge part 255. The first hinge part 255 may be rotatable so that the first temple 250 may be folded or unfolded with respect to the first rim 210. The first hinge part 255 may be formed by using a conductive material (e.g., metal). The first temple 250 may extend along the left side of the head of a user, for example. The second temple 260 may be operatively connected to at least a part of the second rim 220 by using a second hinge part (e.g., the second hinge part 265 in FIG. 2). The second hinge part 265 may be rotatable so that the second temple 260 may be folded or unfolded with respect to the second rim 220. The second hinge part 265 may be formed by using a conductive material (e.g., metal). The second temple 260 may extend along the right side of the head of the user, for example.

According to an embodiment, the first temple 250 may include a first printed circuit substrate 251. The second temple 260 may include a second printed circuit substrate (e.g., the second printed circuit substrate 261 in FIG. 2. Hereinafter, implementations and functions of the first printed circuit substrate 251 and the second printed circuit substrate 261 are substantially the same, and the implementation and function of the first printed circuit substrate 251 may be described.

According to an embodiment, the first printed circuit substrate 251 may include a wireless communication module 310 (e.g., the wireless communication module 192 in FIG. 1). The first printed circuit substrate 251 may include a feed part 312 and a ground 316 electrically connected to the wireless communication module 310.

According to an embodiment, the conductive pattern 320 may be disposed in at least a part of an inner circumference surface of the first rim 210, the bridge 201, and at least a part of an inner circumference surface of the second rim 210. The conductive pattern 320 may be disposed in at least a part of an outer circumference surface of the first glass 215, the bridge 201, and at least a part of an outer circumference surface of the second glass 225. The antenna may be formed of a strip (e.g., as seen in FIG. 3, as indicated by the conductive pattern reference number 320), of an appropriate material for an antenna (e.g., metal) on which the conductive pattern 320 may be formed so as to enhance radiative properties of the antenna.

According to certain embodiments, the conductive pattern 320 may be disposed between at least a part of the inner circumference surface of the first rim 210 and at least a part of the outer circumference surface of the first glass 215 and within the bridge 201. The conductive pattern 320 may be disposed between at least a part of the inner circumference surface of the second rim 220 and at least a part of the outer circumference surface of the second glass 225. The conductive pattern 320 may include a conductive sheet or a conductive film.

According to certain embodiments, a first part 322 of the conductive pattern 320 may be electrically connected to the feed part 312 of the first printed circuit substrate 251, and a second part 326 thereof may be electrically connected to the ground 316 of the first printed circuit substrate 251. For example, the conductive pattern 320 may pass through the interior of the bridge 201 after passing between at least a part of the inner circumference surface of the first rim 210 and at least a part of the outer circumference surface of the first glass 215 in a state in which the first part 322 is electrically connected to the feed part 312, may pass through the interior of the bridge 201 after passing between at least a part of the inner circumference surface of the second rim 220 and at least a part of the outer circumference surface of the second glass 225, and may extend to pass between at least a part of the inner circumference surface of the first rim 210 and at least a part of the outer circumference surface of the first glass 215. The second part 326 of the conductive pattern 320 may be electrically connected to the ground 316. As the conductive pattern 320 is implemented as described above, a loop antenna may be formed.

According to certain embodiments, the first hinge part 255 may be electrically connected to the wireless communication module 310 of the first printed circuit substrate 251, and may perform the function of the feed part 312. In another embodiment, if the first rim 210 and the first temple 250 are operatively connected by using a conductive connection member (e.g., a screw), a conductive connection member (e.g., a screw) may perform the function of the feed part 312.

Figure 4:
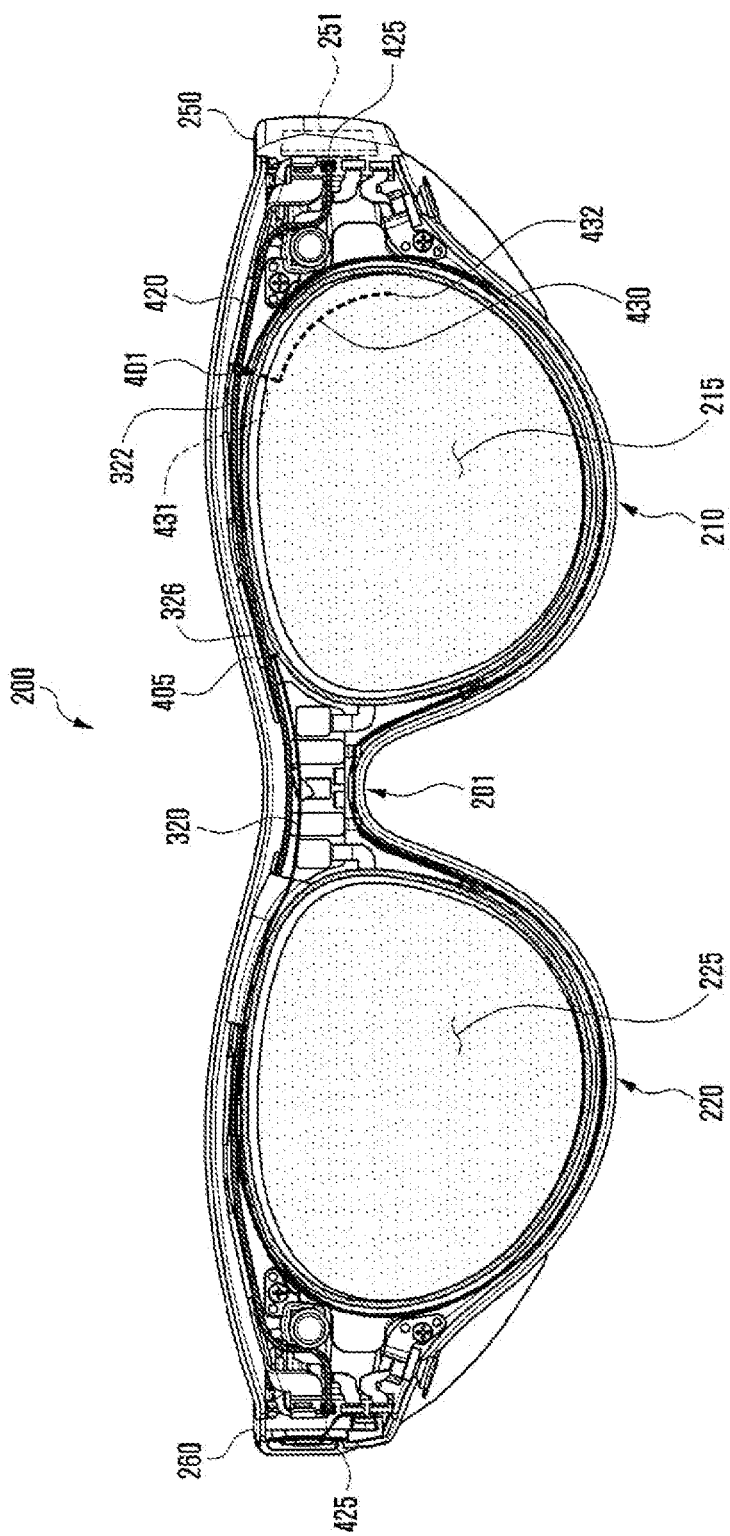
FIG. 4 is a diagram schematically illustrating a wearable electronic device including a plurality of antennas according to certain embodiments of the disclosure.

FIG. 4 is a diagram schematically illustrating a wearable electronic device including a plurality of antennas according to certain embodiments of the disclosure.

FIG. 4 may be a drawing of the wearable electronic device 200 disclosed in FIG. 3 according to certain embodiments of the disclosure, which is viewed in one direction (e.g., a −y axis direction).

A wearable electronic device 200 in FIG. 4 may include embodiments described in the wearable electronic device 200 in FIGS. 2 and/or 3. The wearable electronic device 200 disclosed in FIG. 4 may be a drawing illustrating some components of the wearable electronic device 200 disclosed in FIG. 2. The wearable electronic device 200 disclosed in FIG. 4 may be integrated with or applied to the wearable electronic device 200 in FIGS. 2 and/or 3. In the description of FIG. 4, substantially the same components as those of the embodiments of the wearable electronic device 200 in FIGS. 2 and/or 3 may be assigned the same reference numerals, and a redundant description thereof may be omitted.

With reference to FIG. 4, the wearable electronic device 200 according to certain embodiments of the disclosure may include a bridge 201, a first rim 210, a second rim 220, a first temple 250, a second temple 260, a flexible printed circuit board (FPCB) 420, a conductive pattern 320 and/or a conductive stub 430.

In certain embodiments, the conductive pattern 320 may operate as a first antenna (e.g., a first antenna radiator). The conductive stub 430 may operate as a second antenna (e.g., a second antenna radiator).

According to an embodiment, the bridge 201 may connect the first rim 210 and the second rim 220. The bridge 201 may be formed by using anon-metal material (e.g., polymer).

According to an embodiment, the first rim 210 and the second rim 220 may form a frame (e.g., a glasses frame) of the wearable electronic device 200. The first rim 210 and the second rim 220 may be formed by using anon-metal material (e.g., anon-conductive injection).

According to certain embodiments, the first rim 210 may be disposed in a first direction (e.g., the x axis direction) of the bridge 201 (e.g., on a first side of the bridge). The first rim 210 may be disposed around the left eye of a user. The second rim 220 may be disposed in a second direction (e.g., the −x axis direction) of the bridge 201 (e.g., on a second opposing side of the bridge), that is, a direction opposite to the first direction (e.g., the x axis direction). The second rim 220 may be disposed around the right eye of the user.

According to certain embodiments, the first rim 210 may surround and support at least a part of first glass 215 (e.g., a first display) disposed in an inner circumference surface of the first rim 210. The first glass 215 may be disposed in front of the left eye of a user. The second rim 220 may surround and support at least a part of second glass 225 (e.g., a second display) disposed in an inner circumference surface of the second rim 220. The second glass 225 may be disposed in front of the right eye of a user.

According to an embodiment, the first temple 250 may be operatively connected to at least a part of the first rim 210 by using a first hinge part (e.g., the first hinge part 255 in FIG. 3). The first temple 250 may extend along the left side of the head of a user, for example. The second temple 260 may be operatively connected to at least a part of the second rim 220 by using a second hinge part (e.g., the second hinge part 265 in FIG. 2). The second temple 260 may extend along the right side of the head of a user, for example.

According to an embodiment, the first temple 250 may include a first printed circuit substrate 251. The second temple 260 may include a second printed circuit substrate (e.g., the second printed circuit substrate 261 in FIG. 2). The first printed circuit substrate 251 and/or the second printed circuit substrate 261 may include a wireless communication module (e.g., the wireless communication module 310 in FIG. 3). Hereinafter, implementations and functions of the first printed circuit substrate 251 and the second printed circuit substrate 261 are substantially the same, and the implementation and function of the first printed circuit substrate 251 may be described.

According to an embodiment, the FPCB 420 may be disposed in the interior of the top (e.g., a z axis direction) of the first rim 210 and the second rim 220. The FPCB 420 may be disposed so as to intersect the top of the first glass 215, the bridge 201, and the second glass 225. The FPCB 420 may be electrically connected to the first printed circuit substrate 251 by using a conductive connection member 425 (e.g., a solder, a conductive connector, or a conductive foam spring). The FPCB 420 may include a feed part 401 formed at a portion adjacent to the first printed circuit substrate 251 and have a ground 405 formed at a portion adjacent to the bridge 201. The feed part 401 and the ground 405 may be formed at portions adjacent to the first rim 210. In another embodiment, locations of the feed part 401 and ground 405 of the FPCB 420 are not limited to the aforementioned examples, and the feed part 401 and ground 405 may be formed at various locations.

According to an embodiment, the conductive pattern 320 may be disposed in at least a part of an interior surface of the first rim 210, the bridge 201 and at least a part of an interior surface of the second rim 210. The conductive pattern 320 may be disposed in at least a part of an outer surface of the first glass 215, the bridge 201, and at least a part of the outer surface of the second glass 225.

According to certain embodiments, the conductive pattern 320 may be disposed between at least a part of the inner surface of the first rim 210 and at least a part of the outer surface of the first glass 215 and within the bridge 201. The conductive pattern 320 may be disposed between at least a part of the inner surface of the second rim 220 and at least a part of the outer surface of the second glass 225. The conductive pattern 320 may include a conductive sheet or a conductive film.

According to certain embodiments, the first part 322 of the conductive pattern 320 may be electrically connected to the feed part 401 of the FPCB 420, and the second part 326 thereof may be electrically connected to the ground 405 of the FPCB 420. For example, the antenna structure including the conductive pattern 320 may pass through the interior of the bridge 201 after passing between at least a part of the inner surface of the first rim 210 and at least a part of the outer surface of the first glass 215 in the state in which the first part 322 has been electrically connected to the feed part 401, may pass through the inside of the bridge 201 after passing between at least a part of the inner circumference surface of the second rim 220 and at least a part of the outer circumference surface of the second glass 225, and may extend to at least a part of the inner circumference surface of the first rim 210 and at least a part of the outer circumference surface of the first glass 215. The second part 326 may be electrically connected to the ground 405 of the FPCB 420. As the conductive pattern 320 is implemented as described above, a loop antenna may be formed.

According to an embodiment, the conductive stub 430 may have a first part 431 electrically connected to the feed part 401 of the FPCB 420, and may have a second part 432 extended in a designated length. The conductive stub 430 may be used for the adjustment of a resonant length (e.g., a resonant frequency), a change in the radiation pattern and/or impedance matching. The conductive stub 430 may be formed within the first glass 215.

According to certain embodiments, the feed part 401 may be electrically connected to the first part 322 of the conductive pattern 320 and the first part 431 of the conductive stub 430. The feed part 401 may be electrically connected to the first part 322 of the conductive pattern 320 and the first part 431 of the conductive stub 430 by using a conductive connection member (e.g., a C-clip or a conductive foam spring). The first part 322 of the conductive pattern 320 and the first part 431 of the conductive stub 430 may use the feed part 401 of the FPCB 420 in common.

Figure 5:
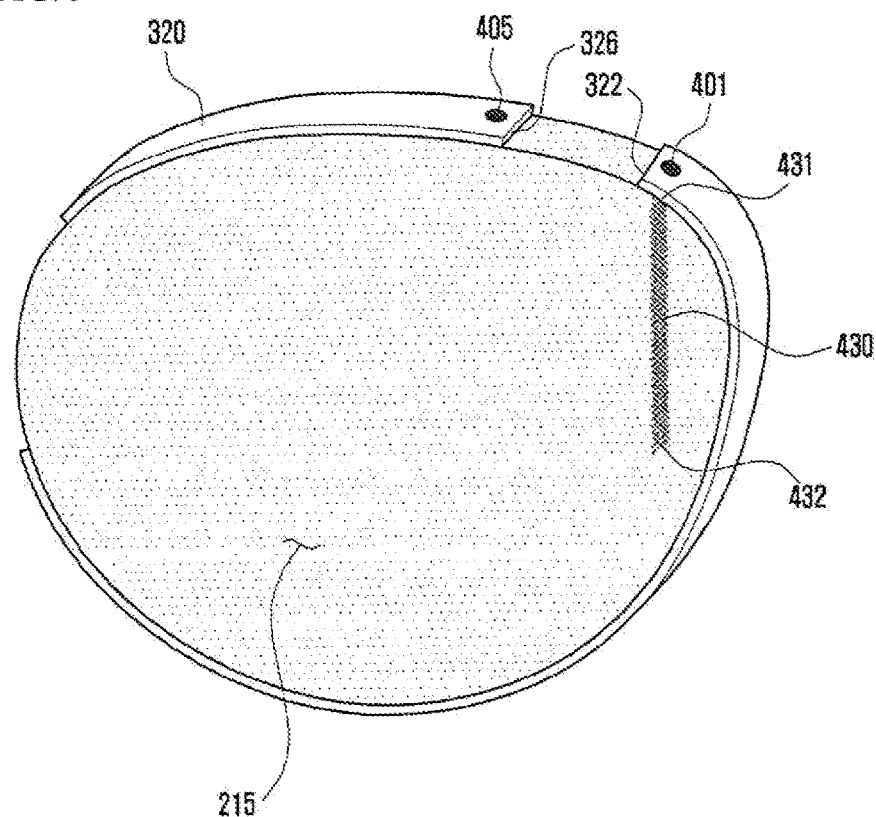
FIG. 5 is a diagram illustrating a form in which a conductive pattern of a wearable electronic device according to certain embodiments of the disclosure surrounds a part of first glass.
Figure 6:
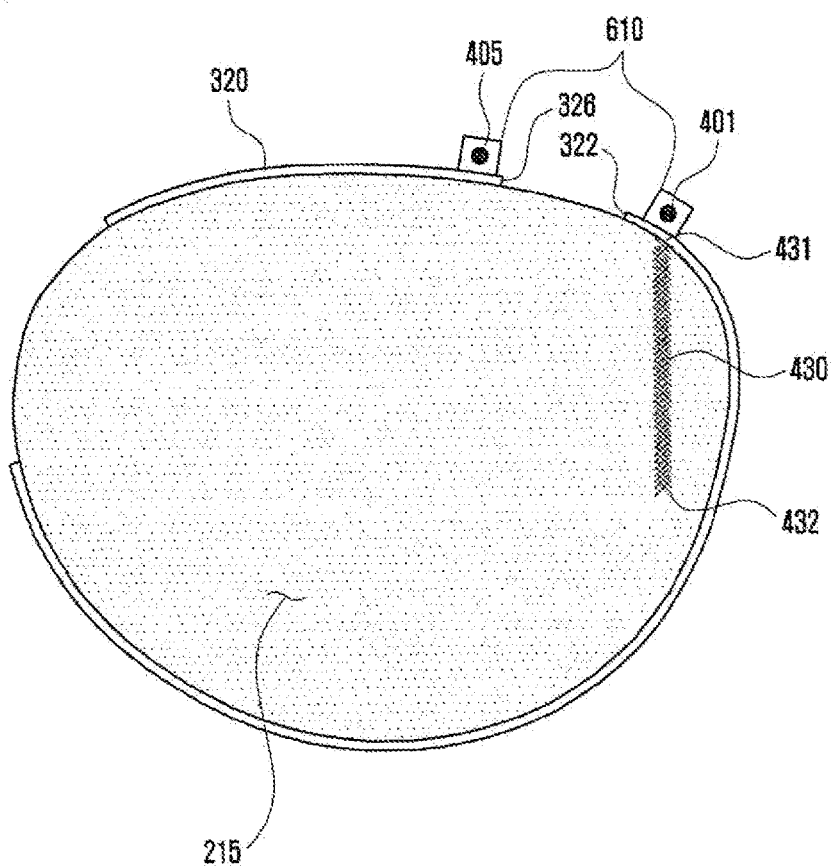
FIG. 6 is a diagram illustrating an embodiment in which a conductive pattern of a wearable electronic device according to certain embodiments of the disclosure surrounds a part of the first glass and includes a conductive connection member.

FIG. 5 is a diagram illustrating a form in which a conductive pattern of a wearable electronic device according to certain embodiments of the disclosure surrounds a part of first glass. FIG. 6 is a diagram illustrating an embodiment in which a conductive pattern of a wearable electronic device according to certain embodiments of the disclosure surrounds a part of the first glass and includes a conductive connection member.

FIGS. 5 and 6 may illustrate embodiments in which a part of the conductive pattern 320 surrounds the first glass 215 of the wearable electronic device 200 according to certain embodiments of the disclosure.

With reference to FIGS. 5 and 6, at least a part of the conductive pattern 320 of the wearable electronic device 200 according to certain embodiments of the disclosure may surround the outer circumference surface (e.g., a border) of the first glass 215.

According to an embodiment, the conductive pattern 320 may include the first part 322 electrically connected to the feed part 401 of an FPCB (e.g., the FPCB 420 in FIG. 4) and the second part 326 electrically connected to the ground 405 of the FPCB 420.

According to an embodiment, the conductive stub 430 may include the first part 431 electrically connected to the feed part 401 of the FPCB 420 and include the second part 432 extended in a designated length. The conductive stub 430 may include at least one of mesh pattern and/or a lattice pattern.

According to certain embodiments, the first part 322 of the conductive pattern 320 and the first part 431 of the conductive stub 430 may be electrically connected to the feed part 401. The first part 322 of the conductive pattern 320 and the first part 431 of the conductive stub 430 may use the feed part 401 of the FPCB 420 in common use.

According to certain embodiments, the feed part 401 of the FPCB 420 may be electrically connected to the first part 322 of the conductive pattern 320 and the first part 431 of the conductive stub 430 by using a conductive connection member 610. The ground 405 of the FPCB 420 may be electrically connected to the second part 326 of the conductive pattern 320 by using the conductive connection member 610. The conductive connection member 610 may include a pad for contact, a coupling member, a C-clip, or a conductive foam spring, for example.

Figure 7:
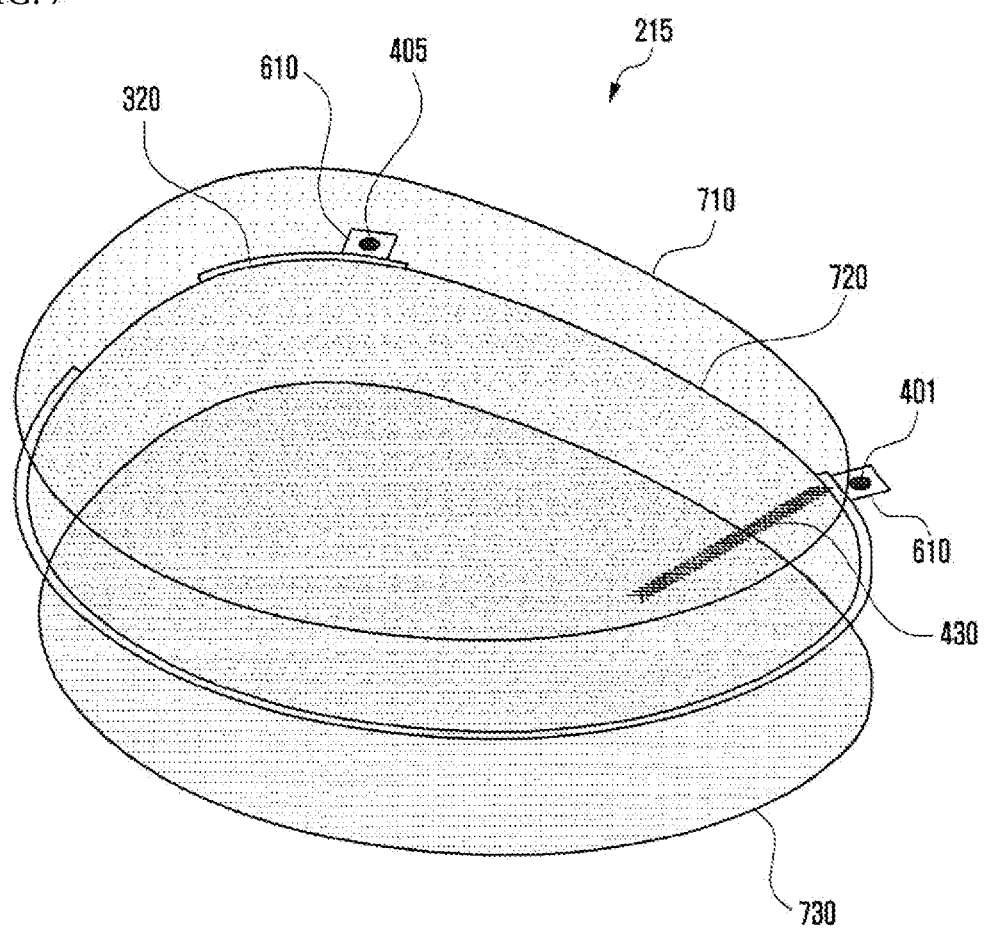
FIG. 7 is a diagram schematically illustrating a implementation of the first glass of the wearable electronic device according to certain embodiments of the disclosure.

FIG. 7 is a diagram schematically illustrating a implementation of the first glass of the wearable electronic device according to certain embodiments of the disclosure.

FIG. 7 describes the first glass 215 of the wearable electronic device 200 according to certain embodiments of the disclosure, but the second glass 225 may also be implemented substantially in the same manner as the first glass 215.

According to an embodiment, the conductive pattern 320 and/or the conductive stub 430 according to certain embodiments of the disclosure may be formed within the first glass 215 (or the second glass 225).

According to an embodiment, the first glass 215 may include a first layer 710, a second layer 720 and/or a third layer 730. For example, the first layer 710 may include a window (e.g., a transparent protection layer). The second layer 720 may include a display panel. The third layer 730 may include a non-conductive support member.

According to certain embodiments, at least a part of the conductive pattern 320 may be formed in an outer circumference surface (e.g., an edge or a border) of the second layer 720 (e.g., the display panel) disposed between the first layer 710 (e.g., a window) and the third layer 730 (e.g., a non-conductive support member). The conductive stub 430 may also be disposed on a surface of the second layer 720 in a designated length.

Figure 8:
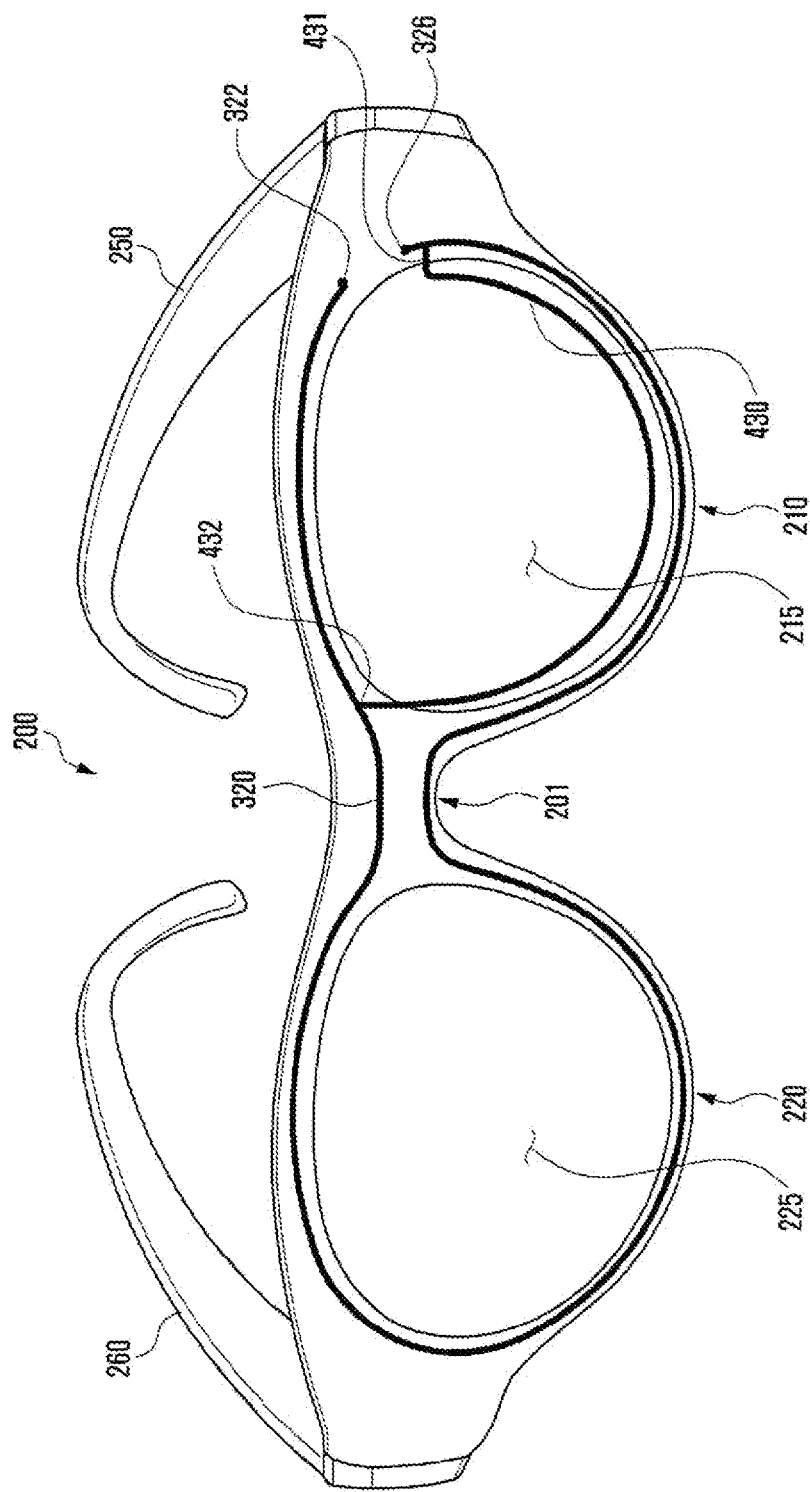
FIG. 8 is a diagram illustrating an embodiment of a conductive pattern of a wearable electronic device according to certain embodiments of the disclosure.

FIG. 8 is a diagram illustrating an embodiment of an antenna including a conductive pattern of a wearable electronic device according to certain embodiments of the disclosure.

According to an embodiment, parts of the antenna including the conductive pattern 320 of the wearable electronic device 200 according to certain embodiments of the disclosure may intersect at the bridge 201. If a portion of the conductive pattern 320 are disposed so as to intersect itself at the bridge 201, an isotropic radiation pattern may be implemented.

According to certain embodiments, the first part 322 of the conductive pattern 320 may pass through the bridge 201 along the inner circumference surface of the first rim 210 or the outer circumference surface of the first glass 215, and may extend along the inner circumference surface of the second rim 220 or the outer circumference surface of the second glass 225, and intersect with itself at the bridge 201. The second part 326 of the conductive pattern 320 may be disposed in a part of the first rim 210. The first part 322 of the conductive pattern 320 may be electrically connected to the feed part 312 or 401, and the second part 326 thereof may be electrically connected to the ground 316 or 405.

Figure 9:
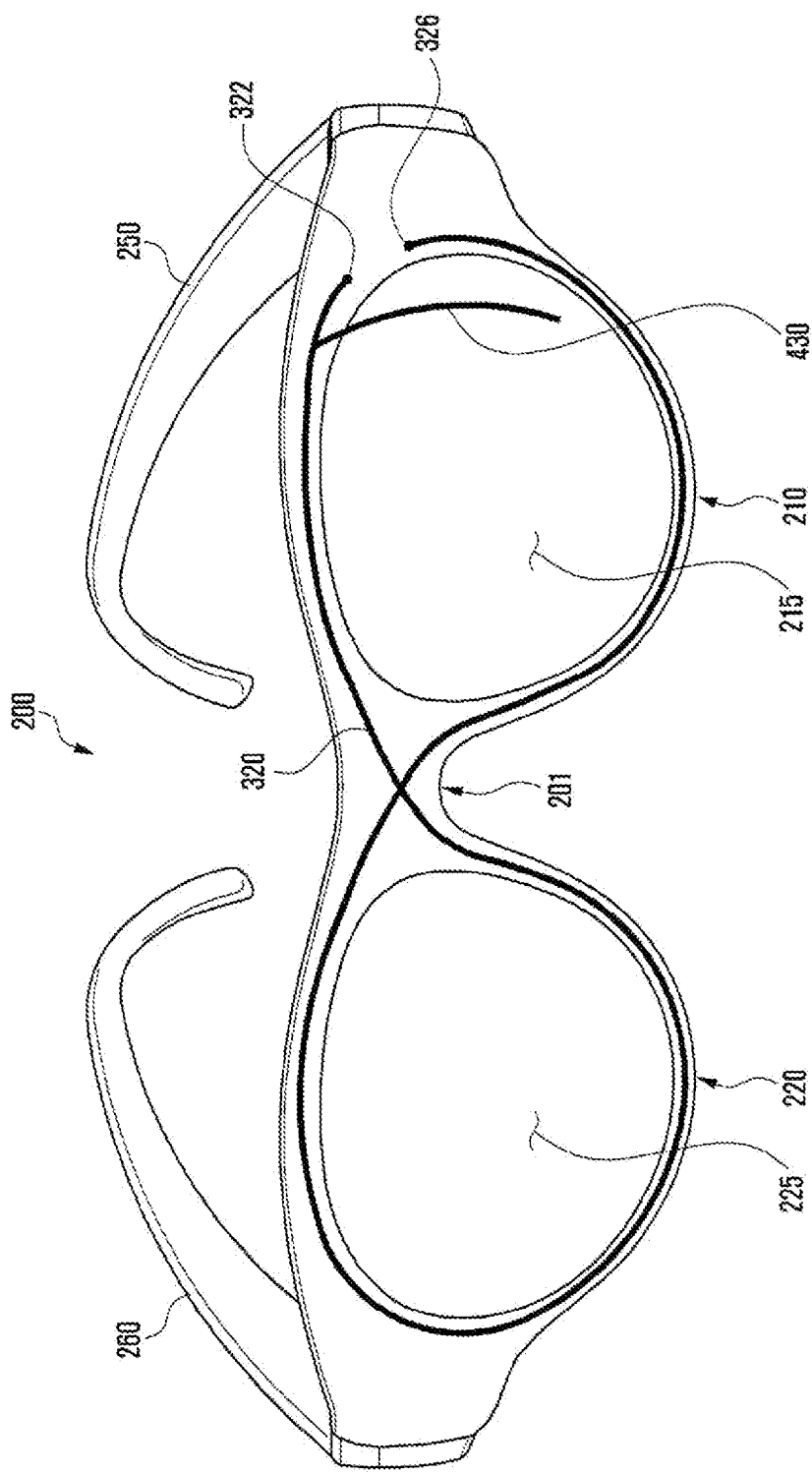
FIG. 9 is a diagram illustrating an embodiment of a conductive stub of a wearable electronic device according to certain embodiments of the disclosure.

FIG. 9 is a diagram illustrating an embodiment of a conductive stub of a wearable electronic device according to certain embodiments of the disclosure.

According to an embodiment, the conductive stub 430 of the wearable electronic device 200 according to certain embodiments of the disclosure may form a loop in the first rim 210. If the conductive stub 430 forms a dual loop along with the conductive pattern 320 in the first rim 210, an additional resonant length can be secured.

According to certain embodiments, the first part 322 of the antenna including the conductive pattern 320 may pass through the bridge 201 along the inner circumference surface of the first rim 210 or the outer circumference surface of the first glass 215, and may extend along the inner circumference surface of the second rim 220 or the outer circumference surface of the second glass 225 and pass through the bridge 201. The second part 326 of the conductive pattern 320 may be disposed in a part of the first rim 210. The first part 322 of the conductive pattern 320 may be electrically connected to the feed part 312 or 401, and the second part 326 may be electrically connected to the ground 316 or 405.

According to an embodiment, the first part 431 of the conductive stub 430 may be electrically connected to the feed part 312 or 401 along with the first part 322 of the conductive pattern 320. The conductive stub 430 may extend along a lower border of the first rim 210 from the first part 322. The second part 432 may be electrically connected to a part of the conductive pattern 320. For example, the conductive stub 430 may form a dual loop along with at least a part of the conductive pattern 320 in the first rim 210.

Figure 10:
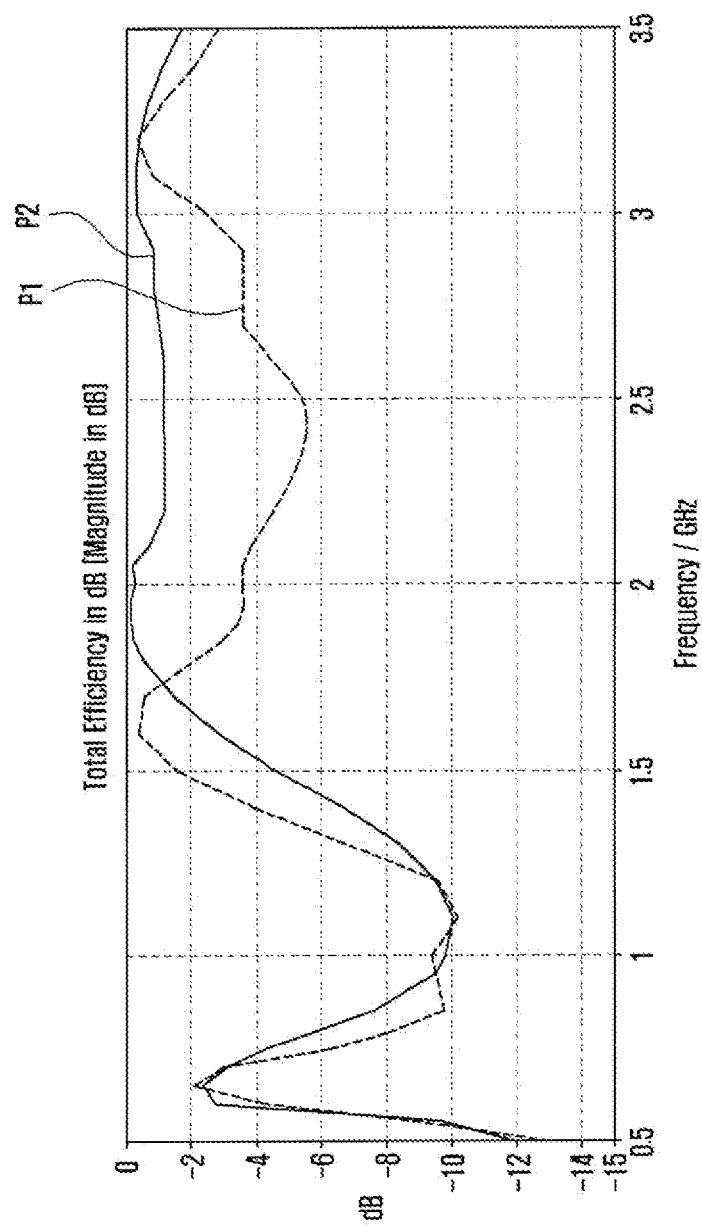
FIG. 10 is a diagram illustrating radiation performance of a wearable electronic device according to certain embodiments of the disclosure and a wearable electronic device according to a comparison embodiment.

FIG. 10 is a diagram illustrating radiation performance of a wearable electronic device according to certain embodiments of the disclosure and a wearable electronic device according to a comparison embodiment.

According to certain embodiments, the conductive pattern 320 of an electronic device (e.g., the electronic device 200 in FIGS. 2 to 4) according to certain embodiments of the disclosure may be disposed in at least a part of the first rim 210, the bridge 201, and the second rim 220, and may operate as a loop antenna. In another embodiment, the wearable electronic device 200 according to certain embodiments of the disclosure may have the conductive stub 430 additionally disposed therein.

According to certain embodiments, a conductive pattern of the wearable electronic device according to the comparison embodiment may be disposed in a part of the first rim 210 or the second rim 220.

With reference to FIG. 10, radiation efficiency of the wearable electronic device 200 according to certain embodiments of the disclosure may appear like P2 (e.g., a solid line in FIG. 10), and radiation efficiency of the wearable electronic device according to the comparison embodiment may appear like P1 (e.g., a dotted line in FIG. 10).

According to an embodiment, it may be seen that the wearable electronic device 200 according to certain embodiments of the disclosure has become better radiation efficiency P2 in about 0.7 GHz to 0.9 GHz band and about 1.7 GHz to 3.2 GHz band compared to radiation efficiency P1 of the wearable electronic device according to the comparison embodiment.

The wearable electronic device 200 according to certain embodiments of the disclosure may include the bridge 201, the first rim 210 disposed in a first direction of the bridge and the second rim 220 disposed in a second direction of the bridge which is a direction opposite to the first direction, the first glass 215 disposed to have at least a part thereof surrounded by the first rim and the second glass 225 disposed to have at least a part thereof surrounded by the second rim, the first temple 250 operatively connected to at least a part of the first rim by using the first hinge part 255 and the second temple 260 operatively connected to at least a part of the second rim by using the second hinge part 265, the first printed circuit substrate 251 disposed within the first temple and including the wireless communication module 310, the FPCB 420 electrically connected to the first printed circuit substrate, disposed in at least a part of the first rim, the bridge, and the second rim, and including the feed part 401 and the ground 405, the conductive pattern 320 disposed in at least a part of the first rim, the bridge, and the second rim, and the conductive stub 430 electrically connected to a part of the conductive pattern. The conductive pattern may have the first part 322 electrically connected to the feed part and extended through the first rim, the bridge, the second rim, and the first rim and have the second part 326 electrically connected to the ground. The conductive stub may be implemented to have the first part 431 electrically connected to the feed part.

According to certain embodiments, the conductive pattern 320 may be implemented so as to operate as a first antenna, and the conductive stub 430 may be implemented so as to operate as a second antenna.

According to certain embodiments, the first rim, the bridge, and the second rim may be formed by using a non-conductive material.

According to certain embodiments, the first printed circuit substrate may be electrically connected to the FPCB by using the conductive connection member 425.

According to certain embodiments, the conductive pattern may be disposed in at least a part of an outer circumference surface of the first glass, the bridge, and an outer circumference surface of the second glass.

According to certain embodiments, the second part 432 of the conductive stub may extend in a designated length.

According to certain embodiments, the conductive stub may include a mesh pattern or a lattice pattern.

According to certain embodiments, the feed part and/or the ground may be electrically connected to the conductive pattern by using the conductive connection member 610.

The conductive connection member 610 may include a pad for contact, a coupling member, a C-clip, or a conductive foam spring.

According to certain embodiments, the first glass may include the first layer 710, the second layer 720, and the third layer 730, and the conductive pattern may be disposed in the outer circumference surface of the second layer.

According to certain embodiments, the conductive stub may be disposed in the second layer 720.

According to certain embodiments, the conductive pattern may be disposed to be intersected at the bridge.

According to certain embodiments, the second part 432 of the conductive stub may extend along at least a part of a border of the first rim, and may be electrically connected to a part of the conductive pattern.

According to certain embodiments, the feed part may be disposed at a portion adjacent to the first printed circuit substrate, and the ground may be disposed at a portion adjacent to the bridge.

The wearable electronic device 200 according to certain embodiments of the disclosure may include the bridge 201, the first rim 210 disposed in a first direction of the bridge and the second rim 220 disposed in a second direction of the bridge which is a direction opposite to the first direction, the first glass 215 disposed to have at least a part thereof surrounded by the first rim and the second glass 225 disposed to have at least a part thereof surrounded by the second rim, the first temple 250 operatively connected to at least a part of the first rim by using the first hinge part 255 and the second temple 260 operatively connected to at least a part of the second rim by using the second hinge part 265, the first printed circuit substrate 251 disposed within the first temple and including the ground 316, the wireless communication module 310 disposed in the first printed circuit substrate and including the feed part 312, and the conductive pattern 320 disposed in at least a part of the first rim, the bridge, and the second rim. The conductive pattern may have the first part 322 electrically connected to the feed part and extended through the first rim, the bridge, the second rim, and the first rim and have the second part 326 electrically connected to the ground.

Although the disclosure has been described above based on certain embodiments of the disclosure, it is natural that a change and a modification within a range that does not depart from the disclosure by a person having ordinary knowledge in the art to which the disclosure pertains also belongs to the disclosure.

What is claimed is:

1. A wearable electronic device, comprising:
    a bridge;
    a first rim disposed on a first side of the bridge and a second rim disposed on a second side of the bridge opposite to the first side;
    a first glass at least partly surrounded by the first rim, and a second glass at least partly surrounded by the second rim;
    a first temple movably connected to at least a part of the first rim using a first hinge part, and a second temple movably connected to at least a part of the second rim using a second hinge part;
    a first printed circuit substrate (PCB) disposed within the first temple and including a wireless communication module;
    an flexible printed circuit substrate (FPCB) that is electrically connected to the first PCB, disposed in at least a part of the first rim, the bridge, and the second rim, and including a feed part and a ground;
    a first antenna including a conductive pattern formed thereon disposed in at least a part of the first rim, the bridge, and the second rim; and
    a conductive stub electrically connected to a part of the conductive pattern,
    wherein the first antenna including the conductive pattern includes:
    a first part electrically connected to the feed part and extending through the first rim, the bridge, the second rim, and the first rim, and
    a second part electrically connected to the ground, and
    wherein the conductive stub includes a first part that is electrically connected to the feed part.

2. The wearable electronic device of claim 1, wherein:
    the conductive pattern operates as the first antenna, and
    the conductive stub operates as a second antenna.

3. The wearable electronic device of claim 1, wherein the first rim, the bridge, and the second rim are formed using a non-conductive material.

4. The wearable electronic device of claim 1, wherein the first PCB is electrically connected to the FPCB using a conductive connection member.

5. The wearable electronic device of claim 1, wherein the first antenna including the conductive pattern is disposed in at least a part of an outer circumference surface of the first glass, the bridge, and an outer circumference surface of the second glass.

6. The wearable electronic device of claim 1, wherein the second part of the conductive stub extends in a designated length into the first glass or the second glass or along a surface thereof.

7. The wearable electronic device of claim 1, wherein the conductive stub comprises at least one of a mesh pattern and a lattice pattern.

8. The wearable electronic device of claim 1, wherein the feed part and/or the ground is electrically connected to the conductive pattern using a conductive connection member.

9. The wearable electronic device of claim 8, wherein the conductive connection member includes at least one of a pad for contact, a coupling member, a C-clip, or a conductive foam spring.

10. The wearable electronic device of claim 1, wherein the first glass includes a first layer, a second layer, and a third layer, and
    wherein the antenna forming the conductive pattern is disposed in an outer circumference surface of the second layer.

11. The wearable electronic device of claim 10, wherein the conductive stub is disposed in the second layer.

12. The wearable electronic device of claim 1, wherein the first antenna including conductive pattern intersects with itself within the bridge.

13. The wearable electronic device of claim 1, wherein a second part of the conductive stub extends along at least a part of a border of the first rim, and is electrically connected to a part of the conductive pattern.

14. The wearable electronic device of claim 1, wherein:
    the feed part is disposed to be adjacent to the first PCB, and
    the ground is disposed to be adjacent to the bridge.

15. A wearable electronic device, comprising:
    a bridge;
    a first rim disposed on a first side of the bridge and a second rim disposed on a second side of the bridge which is opposite to the first side;

a first glass at least partly surrounded by the first rim, and a second glass at least partly surrounded by the second rim;

a first temple movably connected to at least a part of the first rim using a first hinge part, and a second temple movably connected to at least a part of the second rim using a second hinge part;

a first printed circuit substrate (PCB) disposed within the first temple and including a ground;

a wireless communication module disposed on the first PCB and including a feed part; and a first antenna including a conductive pattern formed thereon disposed in at least a part of the first rim, the bridge, and the second rim, wherein the conductive pattern forms a loop around the first rim, the bridge, and the second rim, the loop having a first end electrically connected to the feed part and a second end electrically connected to the ground, wherein the loop comprises two sections, one of the two sections disposed above the other of the two sections in the bridge.

16. The wearable electronic device of claim 15, further comprising: a conductive stub electrically connected to a part of the conductive pattern and formed within the first glass.

17. The wearable electronic device of claim 16, wherein
a first part of the conductive stub is electrically connected to the feed part, and
a second part of the conductive stub extends a designated length into the first glass or the second glass or along a surface thereof.

18. The wearable electronic device of claim 16, wherein the conductive stub comprises at least one of a mesh pattern or a lattice pattern.

19. The wearable electronic device of claim 15, wherein:
the first glass includes a first layer, a second layer, and a third layer, and
the first antenna including the conductive pattern is disposed in an outer circumference surface of the second layer.

20. The wearable electronic device of claim 17, wherein a second part of the conductive stub extends along at least a part of a border of the first rim and is electrically connected to a part of the conductive pattern.

* * * * *